SEMICONDUCTOR DEVICE WITH AN EMITTER, BASE AND COLLECTOR REGION

Filed June 5, 1967 3 Sheets-Sheet 1

INVENTORS:
Dieter Gerstner
Heinz-Wilhelm Ehlbeck
Richard Epple
BY Spencer & Kaye
Attorneys INVENTORS:
Dieter Gerstner
Heinz-Wilhelm Ehlbeck
Richard Epple
BY Spencer & Kaye
Attorneys

SEMICONDUCTOR DEVICE WITH AN EMITTER, BASE AND COLLECTOR REGION

Filed June 5, 1967 3 Sheets-Sheet 3

INVENTORS:
Dieter Gerstner
Heinz-Wilhelm Ehlbeck
Richard Epple
BY Spencer & Kaye
Attorneys

United States Patent Office 3,462,656

Patented Aug. 19, 1969

3,462,656

SEMICONDUCTOR DEVICE WITH AN EMITTER, BASE AND COLLECTOR REGION

Dieter Gerstner, Willsbach, Heinz-Wilhelm Ehlbeck, Heilbronn, and Richard Epple, Schwaigern, Germany, assignors to Telefunken Patentverwertungsgesellschaft m.b.H., Ulm (Danube), Germany Filed June 5, 1967, Ser. No. 643,727

Claims priority, application Germany, June 28, 1966, T 31,469

Int. Cl. H01l *11/00, 15/00*

U.S. Cl. 317—235 9 Claims

ABSTRACT OF THE DISCLOSURE

A semiconductor device having an emitter, base and collector region forming a transistor. The semiconductor device is provided with a diode, connected in parallel with the collector-to-base path of the transistor, which has a breakdown voltage of such value that an impermissibly high current density at the center of the transistor will drive the diode into the breakdown region. Breakdown of the diode causes it to inject charge carriers into the base region so that the emitter injection current will again be uniformly distributed over the boundary of the emitter-to-base barrier layer. The diode thus greatly reduces the danger of thermal destruction of the transistor.

It has been proposed to combine a plurality of individual transistors so as to avoid thermal destruction in the case of increased power loss; the transistors have, in this case, been connected in parallel or series. Transistors have also been proposed which consist of a plurality of individual systems connected to one another in a common semiconductor body. Other proposals provide for the elements which are connected to one another to be thermally coupled but electrically decoupled by means of resistors in the electrode leads.

None of these proposals could, however, completely exclude the possibility of thermal destruction of the transistor. In recent times, the undesirable "pinch in" effect has often been described in many publications, particularly in the case of planar transistors. This effect signifies a so-called "second breakdown" which is irreversible and leads to the destruction of the transistor. As the reverse voltage increases across the collector barrier-layer, the field strength between these space charges in the barrier layer increases until the diffusion current of minority charge carriers originating from the emitter is multiplied as a result of collision ionisation, pair creation and avalanche effect. The additional current is a field current, the carriers of which migrate from the barrier layer to the base connection and so have a reverse current flow in comparison with that during normal operation. Then, if for example in pnp transistors the base current becomes positive, the vector of the electrical field strength, which is associated with the base field current, is directed inwards from the outside. The minority charge carriers in the base are forced inwards. The then resulting high current density in the center of the transistor leads to high power density, the temperature rises rapidly in this region and the result is thermal destruction of the device.

In order to prevent destruction of a semiconductor component having an emitter, base, and collector region, it is now proposed, according to the invention, to connect a diode in parallel with the collector-to-base path, which diode has a forward direction corresponding to that of the collector-to-base junction and has a breakdown voltage which is below the value of the breakdown voltage of the collector-to-emitter path.

The diode may advantageously be set up together with the transistor in a common semiconductor body in integrated form. This is understood to mean the accommodation of the diode and of the transistor in a common semiconductor body. This diode serves as a protective diode to prevent the second breakdown (pinch in) particularly in planar transistors. This applies particularly when the base-to-emitter diode is operated in the reverse direction.

Particularly when a transistor is cut off under inductive load, there is risk of the transistor being destroyed. In order to cut off the transistor, the base-to-emitter diode is switched over from the forward to the reverse direction. Since in the case of an inductance, the current cannot change suddenly, the voltage must rise in a pulse-like manner at the collector barrier-layer until the transistor reaches the breakdown range. While the energy stored in the inductance is being dissipated, there is the risk of the pinch effect becoming effective and the transistor being destroyed. If in accordance with the invention a diode is connected in parallel with the base-to-collector path and if the diode is so dimensioned that the breakdown voltage of the diode is below the value of the breakdown voltage of the collector-to-emitter section, the destruction of the transistor component under high voltages and when being cut off under inductive load is avoided. As soon as the voltage at the collector barrier-layer has reached the value of the breakdown voltage of the diode, a current flows through the diode and switches on the transistor again, that is to say switches the emitter-to-base path of the transistor to the forward direction. Then the current flows in the base zone in the direction which is typical for normal transistor operation which means that the maximum injection occurs at the emitter boundary. Thus no constriction of the injection to a point in the center of the emitter occurs, that is to say there is no "pinch in." It is known that the length of the emitter boundary in a transistor must always be selected large for heavy currents and powers. Accordingly, the generation of heat, caused by the discharge of the inductance, is not dangerous to the transistor so long as it is distributed over the whole emitter boundary.

Since, as a result of the protective diode, the flow of current in the base region with a high collector voltage corresponds to that during normal transistor operation, even in systems having multiple emitters and stabilising resistors in the emitter connections, the favourable effect of the resistors on the uniform distribution of current between the individual emitters is retained. In corresponding transistors systems without a protective diode, these resistors are practically useless or even harmful in the case of breakdown, that is to say the reversal of current in the base, because they amplify the unequal current distribution.

The protective diode itself need only be designed for low powers because it only has to supply the base current to the transistor which then takes over the main current and the main power itself. For these reasons, the protective diode only needs a small, insignificant area and its capacitance remains low. In addition, the protective diode ensures that all the characteristic curves of the transistor have the same breakdown voltage in the $I_c$ versus $U_{CE}$ family of curves.

In order to check these conditions, the following experiment was carried out:

A small diode having a breakdown voltage of 75 v. was soldered externally between the base and collector connections of an ordinary commercial silicon planar transistor BSY45 having a reverse voltage $U_{CB}=100$ v. Then this system was tested for security against "second breakdown." For this purpose, with the base connection open, the collector-to-emitter path was loaded in the reverse direction with a short current pulse (200 $\mu$sec.), the voltage of which was so high that the breakdown voltage would certainly be exceeded.

It was found that in the transistor system with a diode, the height of the current pulse could be increased to 3 a. *without* damage occurring to the system. Then the protective diode was removed and the experiment repeated. In this case, the transistor was already permanently damaged with a current pulse of 2 a. Even after the first loading, the dielectric strength between emitter, base and collector was greatly reduced, obviously the metal-coating over the emitter had been alloyed by local overheating.

The invention will be described and explained in more detail with reference to the accompanying drawings wherein—

Figure 1:
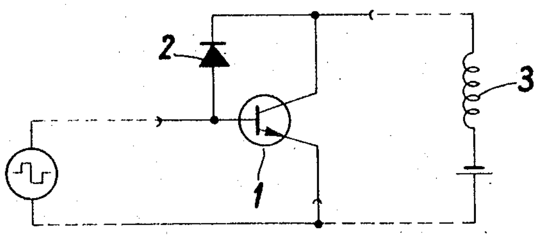
FIGURE 1 shows the basic circuit diagram of the semiconductor component according to the invention.

FIGURE 1 shows the equivalent circuit diagram of the semiconductor device according to the invention, the external circuit shown in broken lines, includes an inductive load 3 in the collector circuit. The equivalent circuit diagram is here represented for npn transistors, but a corresponding circuit would naturally also apply to pnp transistors. A diode 2 is connected in parallel with the collector-to-base path of the transistor 1 in such a manner that its forward direction corresponds to the forward direction of the collector barrier-layer. If the transistor is alternately switched on and off through pulse operation for example, the reverse voltage at the collector-to-base path rises abruptly due to the switching off until the diode, which is loaded in the reverse direction, enters the range of the Zener or avalanche breakdown. Then a current flows through the diode to the base, raises its potential until the transistor is again switched into the "on state" and this takes over the greater part of the current flow caused by the energy stored in the coil 3.

Figure 2:
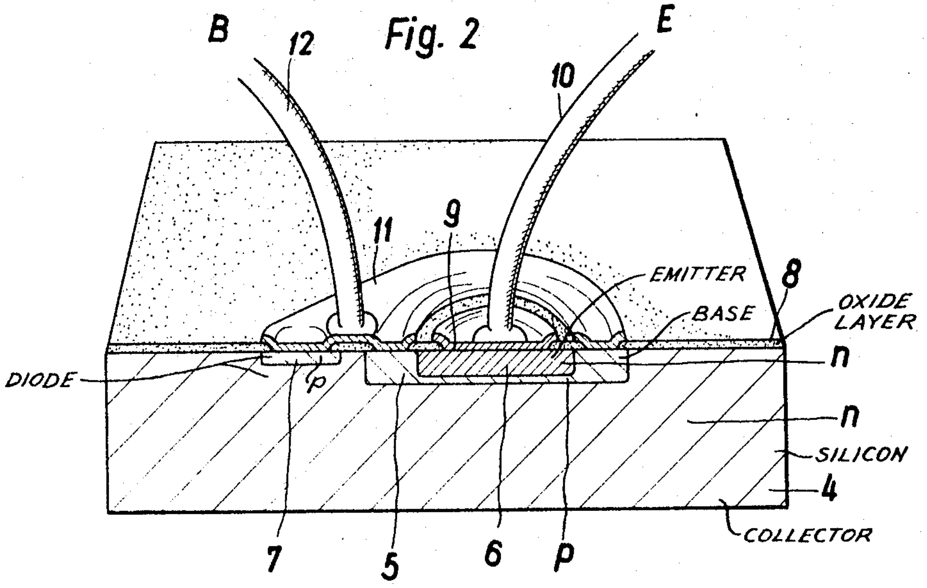
FIGURE 2 shows in section an exemplary embodiment wherein the protective diode is set up in the semiconductor body beside the actual base region and is connected to the base region.

FIGURE 2 shows a semiconductor body 4 in which transistor and protective diode are accommodated in integrated fashion. The lower portion of the semiconductor body forms the collector region of the transistor and one element of the diode. A base region 5 of the transistor is set up in the semiconductor body 4 with a conductivity opposite to that of the collector region beneath and an emitter region 6 is in turn set up in the base region 5. Apart from the actual base region 5, a further region 7 with the same type of conductivity as the base region is introduced into the semiconductor body, but its depth of penetration is less than that of the base region 5. As a result of the lower depth of penetration of the region 7, its impurity gradient at the junction between the region 7 and the collector region of the semiconductor body 4 is considerably higher, with the same surface concentration, than that at the junction between the base region 5 and the collector body 4 so that the protective diode formed from the collector region and the region 7 reaches its breakdown voltage before the collector barrier-layer under reverse-voltage loading. In this manner, a dielectric breakdown of the collector barrier-layer below the emitter and hence any subsequent thermal destruction of the transistor is prevented. The depth of penetration of the region 7 serves as a measure of the value of the breakdown voltage. Thus with p-diffusion into homogeneously n-doped silicon, with a depth of penetration of 5 $\mu$m. for example, the breakdown voltage was measured at 70 v. whereas, with a depth of penetration of 1 $\mu$m., the breakdown voltage was 30 v.

In the example, the surface of the semiconductor body is covered by an oxide layer 8 which has apertures at the points where contact is made. There the regions of the semiconductor device are provided with conducting paths; for example, contact is made to the emitter region 6 by means of a conducting path 9 and a supply wire 10. The region 7 and the base region 5 are contacted by a common conducting path 11 and a supply wire 12. The effectiveness of the illustrated embodiment is retained even if the base region 5 and the region 7, which has the same type of conductivity as the base region, are directly connected to one another in the semiconductor body. What is important is that the depth of the penetration of the region 7 is less than that of the base region 5.

Figure 3:
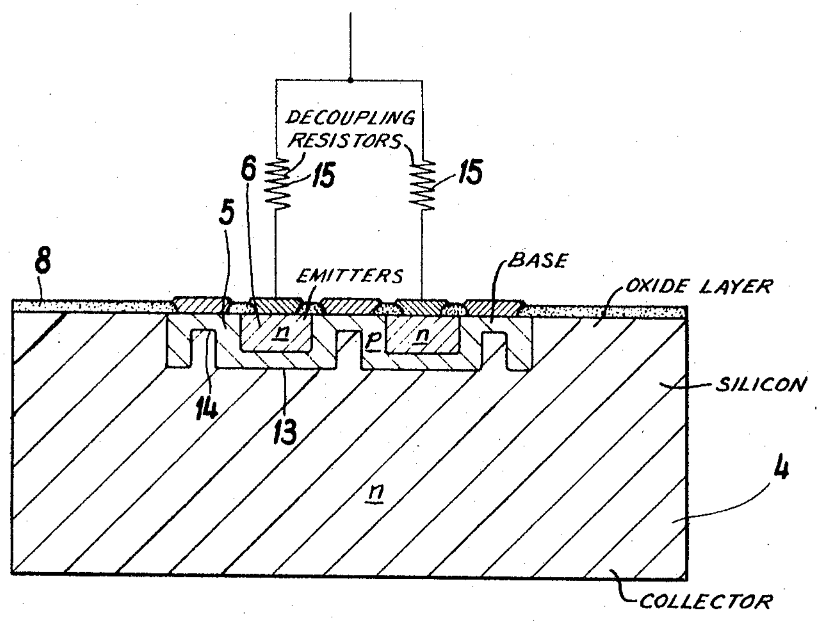
FIGURE 3 shows a transistor having a plurality of individual emitters and decoupling resistors in the emitter leads. The base has regions having different penetration depths.

FIGURE 3 shows an example of an embodiment with a plurality of emitters and additional decoupling resistors in the emitter leads. A base region 5 is again set up in the collector body 4 which now has regions 13 and 14 with different depths of penetration. The emitter regions are set up in the regions 13 with greater depth of penetration, while the regions having lower depths of penetration act as protective diodes. These diodes protect the centers of the transistor below the emitters from the pinch effect which leads to the thermal destruction of the device. The individual emitters of the device are electrically decoupled by means of resistors 15 in the emitter leads in an advantageous manner in order to achieve a uniform load distribution between the individual elements. The mode of operation of the protective diode corresponds to that described with reference to FIGURE 2. Here, too, as a result of the lower depth of penetration and the higher impurity gradient in the regions 14, the breakdown voltage of the diodes is below the value of the breakdown voltage which applies to the collector barrier-layer zone below each emitter regions. Naturally, the number of individual emitters is not limited in the arrangement described just as the size of the decoupling resistors can be adapted to the circumstances or these may be omitted entirely.

Figure 4:
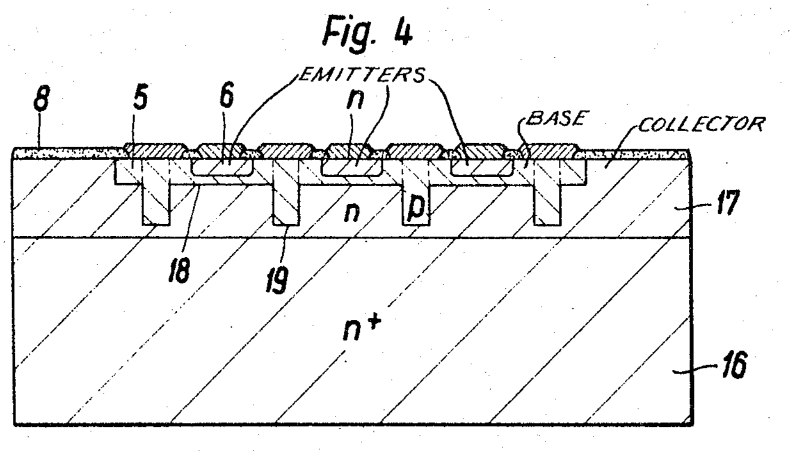
FIGURE 4 shows a semiconductor device built up in a manner similar to the device of FIGURE 3.

FIGURE 4 shows a further embodiment of the present invention, the working principle of which differs somewhat from that described hitherto. The device consists of a heavily doped epitaxial substrate 16, which is $n^+$-doped in the example, on which there is a further semiconductor layer 17, for example of epitaxially deposited material, which forms the actual collector region. The collector region 17 is more lightly n-doped than the substrate 16. A base region 5 having regions with different depths of penetration 18 and 19 is again introduced into the collector region. In this example, the emitter region or regions 6 are set up in the regions having lower depths of penetration 18 either by alloying or by diffusion. The regions having a greater depth of penetration 19 extend into the immediate vicinity of the heavily doped substrate and serve as protective diodes for the actual transistor region below the emitter regions.

When the collector barrier-layer is loaded by a voltage in the reverse direction, the space-charge region expands. As far as the regions 19 are concerned, this expansion is substantially only possible until the space-charge region abuts against the heavily doped substrate 16. In the heavily doped region, the space-charge region scarcely expands any further so that, as the reverse voltage increases, the field strength rises in the barrier region up to a value which leads to the dielectric breakdown. This restriction in the possibility of expansion of the space charge region does not apply to the collector barrier-layer in the region below the emitters because here the distance to the heavily doped basic material is relatively great. Thus here, too, the distance between the base regions having a greater depth of penetration and the heavily doped substrate can be regarded as a measure of the breakdown voltage of the device.

The arrangement described above applies both to transistors with a plurality of emitters and to those with one emitter; also in the described arrangement, additional decoupling resistors may be installed in the emitter leads and may be formed, for example, by metal layers vapour-deposited on the oxide layer. It is an advantage to dope more heavily the base regions 19 that have the greater depth of penetration than the remaining base regions and thus serve at the same time as conducting gratings for a low-resistance current supply to the active regions of the transistor below the emitter regions.

Figure 5:
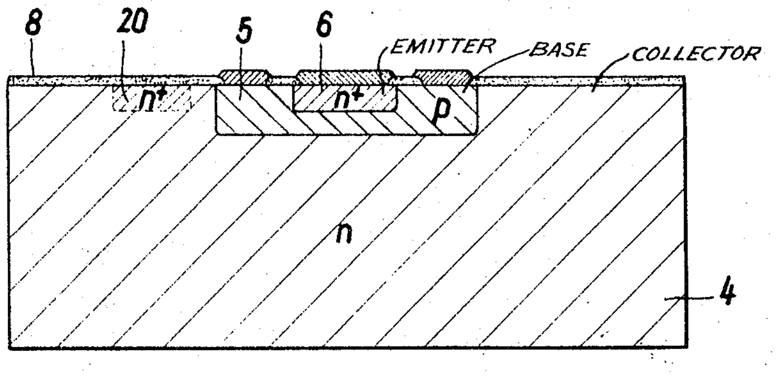
FIGURE 5 shows a further exemplary embodiment having a heavily doped region, to which contact is not made, in the collector body beside the actual base region.

A last example of an embodiment of the invention is illustrated in FIGURE 5. A base region 5 is again set up in the semiconductor body 4 and an emitter region 6 is set up in the base region. As in the arrangement described with reference to FIGURE 2, a region 20 has been set up beside the base region, but is here heavily doped and has the conductivity type of the collector region. Its doping and its distance from the base region determines the value of the breakdown voltage of the semiconductor device. Here, too, the space charge zone extends at the collector barrier-layer as the reverse voltage increases. In the zone of the region 20, however, because of its heavy doping, such a deep extension as takes place in the other regions of the collector barrier-layer is prevented so that the field strength rises rapidly between the region 20 and the base region until a Zener or avalanche breakdown occurs at this point. The region 20 is preferably set up by diffusion in the semiconductory body jointly with the setting up of the emitter regions, but it may also be set up by an alloying process.

In all the said examples, the breakdown voltage of the diode is preferably so dimensioned that its breakdown voltage amounts to about 80% of the collector-to-emitter breakdown voltage, the area of the diode barrier layer amounting to 10% of the area of the base-to-collector barrier layer.

The feature common to all the described examples is that, in conjunction with transistors, particularly planar transistors, protective diodes are used which prevent a second breakdown leading to thermal destruction of the component.

We claim:

1. A semiconductor device having an emitter region of a first conductivity, a base region of a second conductivity and a collector region of said first conductivity, said regions forming a transistor with an emitter-to-base barrier layer and a base-to-collector barrier layer, said device further comprising a diode having a barrier layer, the area of said barrier layer of said diode being small compared to the area of said base-to-collector barrier layer, said diode being connected in parallel with the collector-to-base path of said transistor and said diode constituting means for producing a breakdown voltage of such value that an impermissably high current density in the center of said transistor will drive said diode into the breakdown region, thereby, upon breakdown, causing said diode to inject charge carriers into said base region with the result that emitter injection current will again be uniformly distributed over the boundary of said emitter-to-base barrier layer.

2. The semiconductor device defined in claim 1, wherein said regions are formed in a semiconductor body, said base region being formed with a prescribed first depth of penetration in said semiconductor body, and wherein said diode is formed in said semiconductor body by a partial region with a prescribed second depth of penetration, said partial region having the same conductivity as said base region but having a lower depth of penetration and a higher impurity gradient than said base region.

3. The semiconductor device defined in claim 1, wherein said base region is formed in a semiconductor body with zones of different depths of penetration and said emitter region is formed in ones of said zones having the greater depth of penetration, the portion of said semiconductor body beneath said base region forming said collector region and each of said zones having the lower depth of penetration serving, through its lower breakdown voltage, as said diode for the region of said base-to-collector barrier layer situated below said emitter region.

4. The semiconductor device defined in claim 1, wherein said collector region is formed in a lightly doped semiconductor body arranged on a heavily doped substrate; wherein said base region is formed in said collector region with zones of different depths of penetration; wherein said emitter region is formed in each of said zones having a lower depth of penetration and wherein each zone having a greater depth of penetration extends to the immediate vicinity of said heavily doped substrate, whereby a dielectric breakdown takes place earlier at the barrier layer of said each zone having a greater depth of penetration than at the base-to-collector junction of said each zone having a lower depth of penetration.

5. The semiconductor device defined in claim 4, wherein the distance between said each zone having a greater depth of penetration and said heavily doped substrate is arranged in dependence upon the desired breakdown voltage of said transistor.

6. The semiconductor device defined in sclaim 1, wherein said transistor is a planar transistor and wherein a heavily doped region is formed in said collector region of said transistor, said heavily doped region having the same conductivity as said collector region and being spaced apart from said base region by a distance so small that the value of the breakdown voltage at this point is below the value of the breakdown voltages at the other points on said base-to-collector barrier layer.

7. The semiconductor device defined in claim 6, wherein said heavily doped region is alloyed into said collector region in the immediate vicinity of the base-to-collector pn-junction.

8. The semiconductor device delned in claim 1, wherein said breakdown voltage of said diode is approximately 80% of the emitter-to-collector breakdown voltage of said transistor.

9. The semiconductor device delned in claim 1, wherein said area of said barrier layer of said diode is approximately 10% of said area of said base-to-collector barrier layer.

References Cited

UNITED STATES PATENTS

| | | | |
|---|---|---|---|
| 2,655,608 | 10/1953 | Valdes | 317—234 X |
| 3,210,620 | 10/1965 | Lin | 317—234 |
| 3,403,306 | 9/1968 | Haitz et al. | 317—235 |
| 3,154,692 | 10/1964 | Shockley | 307—88.5 |
| 3,178,804 | 4/1965 | Ullery et al. | 29—155.5 |
| 3,209,279 | 9/1965 | Kambouris | 331—78 |

FOREIGN PATENTS

| | | |
|---|---|---|
| 845,092 | 8/1960 | Great Britain. |

JAMES D. KALLAM, Primary Examiner

S. BRODER, Assistant Examiner